United States Patent
Shinkawa (10) Patent No.: US 7,055,051 B2
(45) Date of Patent: May 30, 2006

(54) CLOCK SWITCH DEVICE AND MICROCONTROLLER FOR SELECTING ONE OF A PLURALITY OF CLOCKS BASED ON SIGNAL LEVELS

(75) Inventor: Kazuaki Shinkawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 659 days.

(21) Appl. No.: 10/230,110

(22) Filed: Aug. 29, 2002

(65) Prior Publication Data

US 2003/0046597 A1    Mar. 6, 2003

(30) Foreign Application Priority Data

Aug. 30, 2001    (JP)    ............... 2001-261290

(51) Int. Cl.
*G06F 1/06*    (2006.01)
*G06F 1/08*    (2006.01)

(52) U.S. Cl. ............ 713/500; 375/357; 327/144; 327/141; 327/142

(58) Field of Classification Search ............ None
See application file for complete search history.

(56) References Cited

U.S. PATENT DOCUMENTS

| | | | |
|---|---|---|---|
| 4,899,351 A | * | 2/1990 | Bonke ............... 375/357 |
| 5,479,648 A | | 12/1995 | Barbera et al. |
| 5,790,609 A | | 8/1998 | Swoboda |
| 6,158,012 A | | 12/2000 | Watts, Jr. |

OTHER PUBLICATIONS

Tanenbaum, Andrew S., Structured Computer Organization, 1984, Prentice-Hall, Inc., $2^{nd}$ Edition, p. 11.*

* cited by examiner

*Primary Examiner*—Lynne H. Browne
*Assistant Examiner*—Anand B. Patel
(74) *Attorney, Agent, or Firm*—McDermott Will & Emery LLP (57) ABSTRACT

The clock switch device of the present invention includes: a clock detector for receiving a plurality of clocks and clock selection data designating a clock to be selected, detecting whether or not the clock designated by the clock selection data among the plurality of clocks changes in signal level, and outputting the result as a detection signal; a control register for holding and outputting the clock selection data when the detection signal indicates that the clock designated by the clock selection data changes in signal level; and a selector for receiving the plurality of clocks and selecting a clock corresponding to the output of the control register among the plurality of clocks.

12 Claims, 9 Drawing Sheets

CLOCK SWITCH DEVICE AND MICROCONTROLLER FOR SELECTING ONE OF A PLURALITY OF CLOCKS BASED ON SIGNAL LEVELS

BACKGROUND OF THE INVENTION

The present invention relates to semiconductor integrated circuits such as microcontrollers.

There are known microcontrollers that receive a high-speed clock output from a high-speed oscillation circuit and a low-speed clock output from a low-speed oscillation circuit and select one of these clocks for use as the current clock. In this type of microcontrollers, the clock can be switched by software during operation, to realize high-speed operation by selecting the high-speed clock or low power consumption by selecting the low-speed clock.

When it is not necessary to use one of the high-speed oscillation circuit or the low-speed oscillation circuit, the unused oscillation circuit is often blocked from connection with an external crystal and the like, to reduce the cost for external components. A microcontroller adopting this method is provided with a circuit for selecting the output of an oscillation circuit in operation as the clock at the time of resetting.

Figure 9:
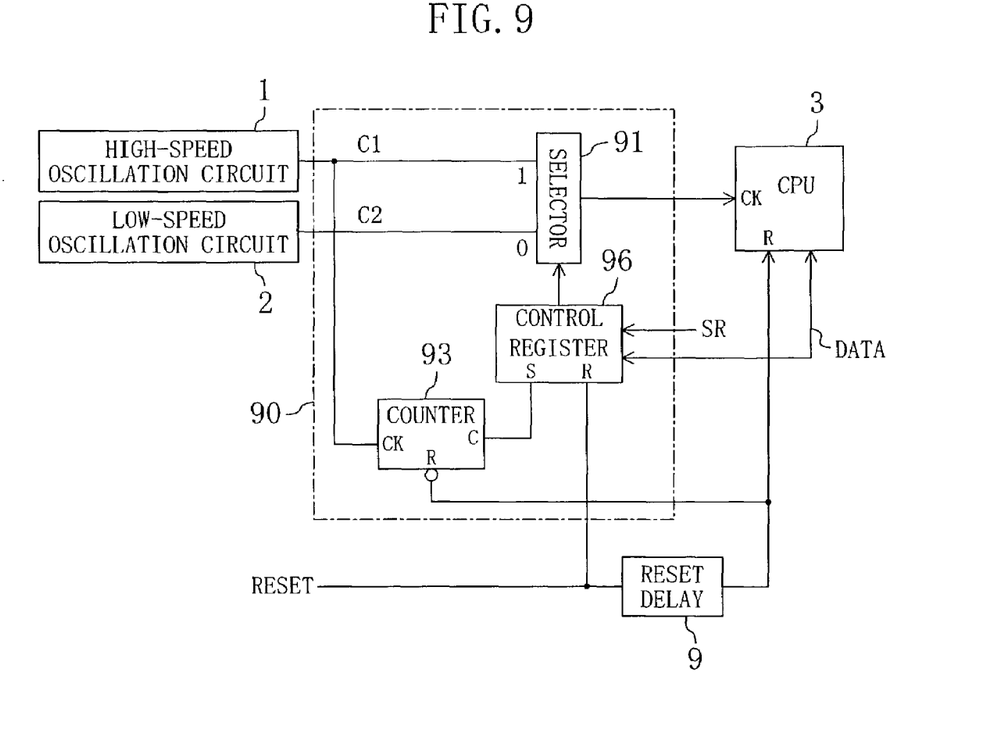
FIG. 9 is a block diagram of a microcontroller including a conventional clock switch device.

FIG. 9 is a block diagram of a microcontroller including a conventional clock switch device. The clock switch device, denoted by 90, includes a selector 91, a counter 93 and a control register 96. When a reset signal is made active, the control register 96 is reset and outputs "0". The selector 91 then selects a low-speed clock C2 output from a low-speed oscillation circuit 2 and outputs the selected clock to a CPU 3.

If an external crystal is in connection with a high-speed oscillation circuit 1 and the high-speed oscillation circuit 1 is in operation, the counter 93 overflows after counting up a predetermined number of pulses. By this overflow, the control register 96 is set and outputs "1". The selector 91 then selects a high-speed clock C1 output from the high-speed oscillation circuit 1 and outputs the selected clock to the CPU 3. If an external crystal is not in connection with the high-speed oscillation circuit 1, the high-speed oscillation circuit 1 does not operate and thus the counter 93 does not overflow. Therefore, the selector 91 continues selecting the low-speed clock C2 output from the low-speed oscillation circuit 2.

After release of the reset, the counter 93 is cleared after the lapse of a fixed time set by a reset delay circuit 9, and the control register 96 is made rewritable. The CPU 3 can now rewrite data in the control register 96 by software to freely switch the selector 91.

The conventional clock switch device described above has the following problem at the time of clock switching by software. That is, after release of the reset, the CPU 3 can freely switch the selector 91 by software. Therefore, the CPU 3 may possibly select a clock output from an oscillation circuit that currently stops oscillating or stops outputting a clock due to non-connection with an external crystal. In such an event, no clock will be supplied to the CPU 3, and this may cause a deadlock.

SUMMARY OF THE INVENTION

An object of the present invention is providing a clock switch device capable of blocking selection of a clock staying at a halt to thereby prevent occurrence of a deadlock of a microcontroller and the like.

The present invention is directed to a clock switch device for selecting one clock from a plurality of clocks and outputting the selected clock, wherein the clock switch device is configured not to select a clock of which selection is intended when the clock does not change in signal level.

With the above configuration, it is possible to avoid a clock having no change in signal level, that is, a clock at a halt from being selected and output.

Alternatively, the present invention is directed to a clock switch device including: a clock detector for receiving a plurality of clocks and clock selection data designating a clock to be selected, detecting whether or not the clock designated by the clock selection data among the plurality of clocks changes in signal level, and outputting the result as a detection signal; a control register for holding and outputting the clock selection data when the detection signal indicates that the clock designated by the clock selection data changes in signal level; and a selector for receiving the plurality of clocks and selecting a clock corresponding to the output of the control register among the plurality of clocks.

With the above configuration, in selection of a clock designated by the clock selection data, it is possible not to select the clock when the clock does not change in signal level.

In the clock switch device described above, preferably, the clock detector includes: a pre-control register for holding and outputting the clock selection data; a pre-selector for receiving the plurality of clocks, selecting a clock corresponding to the output of the pre-control register among the plurality of clocks, and outputting the selected clock; and a counter for counting the number of pulses of the output of the pre-selector and outputting an overflow signal changing in signal level when the count value reaches a predetermined value as the detection signal.

With the above configuration, a comparatively small-scale circuit can detect a change in the signal level of a clock.

Preferably, the counter is a programmable counter capable of changing the predetermined value.

With the above configuration, the time for detecting a change in the signal level of a clock can be varied. This can reduce erroneous detection by considering influence of noise.

Preferably, the counter initializes the count value when the counter receives a switch request signal for enabling the clock selection data to be held in the pre-control register.

In the clock switch device described above, preferably, the clock detector includes: a pre-control register for holding and outputting the clock selection data; a pre-selector for receiving the plurality of clocks, selecting a clock corresponding to the output of the pre-control register among the plurality of clocks, and outputting the selected clock; a plurality of counters connected in series, each for counting the number of pulses of an input signal and outputting an overflow signal changing in signal level every time the count value reaches a predetermined value; and a counter output selector for selecting one of the overflow signals output from the plurality of counters according to a counter selection signal and outputting the selected signal as the detection signal, wherein the first-stage counter of the plurality of counters connected in series receives the output of the pre-selector.

With the above configuration, the time for detecting a change in the signal level of a clock can be selected. This can reduce erroneous detection by considering influence of noise.

In the clock switch device described above, the clock detector includes: a pre-control register for holding and outputting the clock selection data; a pre-selector for receiving the plurality of clocks, selecting a clock corresponding to the output of the pre-control register among the plurality of clocks, and outputting the selected clock; a plurality of counters, each for counting the number of pulses of the output of the pre-selector and outputting an overflow signal changing in signal level when the count value reaches a predetermined value; and a counter output selector for selecting one of the overflow signals output from the plurality of counters according to the counter selection signal and outputting the selected signal as the detection signal.

With the above configuration, the time for detecting a change in the signal level of a clock can be selected.

In the clock switch device described above, the clock detector detects whether or not a predetermined clock changes in signal level after resetting and outputs the result as the detection signal, and the control register outputs the corresponding data so that the selector selects the predetermined clock when the detection signal indicates that the clock changes in signal level.

With the above configuration, in selection of a predetermined clock after resetting, it is possible not to select the clock when the clock does not change in signal level.

In the clock switch device described above, the clock detector includes: a pre-control register for holding and outputting the clock selection data; a pre-selector for receiving the plurality of clocks, selecting a clock corresponding to the output of the pre-control register among the plurality of clocks, and outputting the selected clock; and a counter for counting the number of pulses of the output of the pre-selector and outputting an overflow signal changing in signal level when the count value reaches a predetermined value.

Preferably, the counter initializes the count value when the counter receives either a switch request signal for permitting the clock selection data to be held in the pre-control register or a reset signal for enabling the resetting.

Alternatively, the present invention is directed to a clock switch device including: a plurality of clock detectors for receiving different clocks, detecting whether or not the clocks change in signal level, and outputting the results as detection signals; a control register for receiving and holding clock selection data designating a clock to be selected, changing the held data and outputting the changed data when any of the detection signals indicates that the corresponding clock does not change in signal level, so that the corresponding clock is not selected; and a selector for selecting a clock corresponding to the output of the control register among the plurality of clocks input into the plurality of clock detectors.

With the above configuration, it is possible not to select a clock having no change in signal level even when the clock is designated by the clock selection data.

Preferably, after resetting, the control register outputs data corresponding to a predetermined clock to enable the selector to select the clock.

According to another aspect, the present invention is directed to a microcontroller including a clock switch device and a CPU, wherein the clock switch device includes: a clock detector for receiving a plurality of clocks and clock selection data designating a clock to be selected, detecting whether or not the clock designated by the clock selection data among the plurality of clocks changes in signal level, and outputting the result as a detection signal; a control register for holding and outputting the clock selection data when the detection signal indicates that the clock designated by the clock selection data changes in signal level; and a selector for receiving the plurality of clocks and selecting a clock corresponding to the output of the control register among the plurality of clocks, and wherein the CPU outputs the clock selection data by executing software.

With the above configuration, in switching of a clock according to clock selection data determined by software, it is possible not to select a clock designated by the clock selection data when the clock does not change in signal level. This prevents occurrence of a deadlock of the microcontroller.

DESCRIPTION OF THE PREFERRED EMBODIMENTS

Hereinafter, preferred embodiments of the present invention will be described with reference to the accompanying drawings.

Embodiment 1

Figure 1:
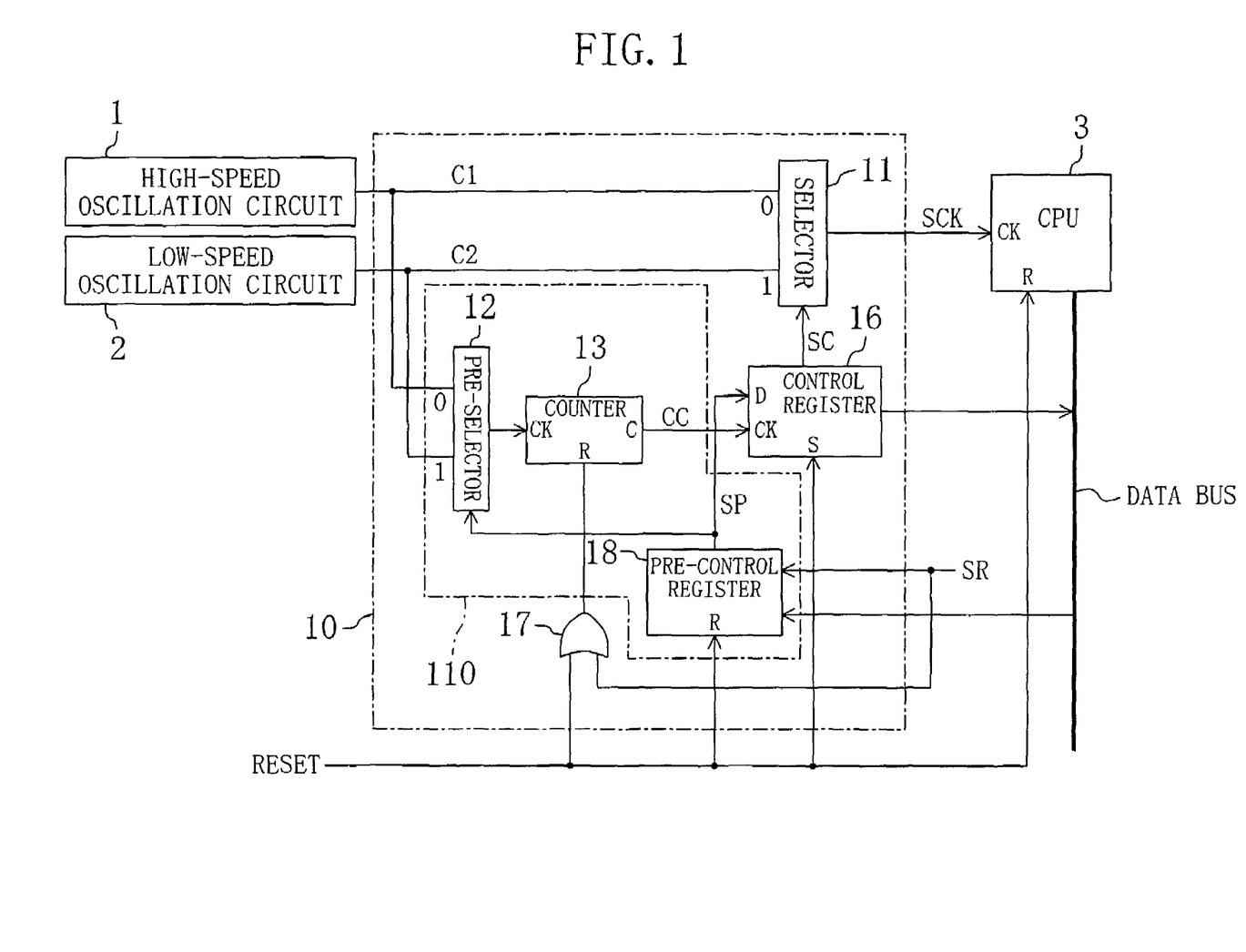
FIG. 1 is a block diagram of a microcontroller including a clock switch device of Embodiment 1 of the present invention.

FIG. 1 is a block diagram of a microcontroller including a clock switch device of Embodiment 1 of the present invention. The microcontroller of FIG. 1 includes a high-speed oscillation circuit 1, a low-speed oscillation circuit 2, a CPU 3 and a clock switch device 10. The clock switch device 10 includes a selector 11, a pre-selector 12, a counter 13, a control register 16, an OR gate 17 and a pre-control register 18. The pre-selector 12, the counter 13 and the pre-control register 18 constitute a clock detector 110.

Each of the high-speed oscillation circuit 1 and the low-speed oscillation circuit 2 is configured to be connectable with an external crystal. When one of the high-speed oscillation circuit 1 and the low-speed oscillation circuit 2 is not necessary to operate, the non-operating oscillation circuit is not connected with the external crystal.

The high-speed oscillation circuit 1 outputs a high-speed clock C1 to the selector 11 and the pre-selector 12. The low-speed oscillation circuit 2 outputs a low-speed clock C2 to the selector 11 and the pre-selector 12. The frequency of the high-speed clock C1 is relatively high, which is 20 MHz, for example. The frequency of the low-speed clock C2 is relatively low, which is 32 kHz, for example.

The CPU 3 outputs clock selection data for designating the clock to be selected to the pre-control register 18 via a data bus. A pulse of a reset signal RESET is sent to the CPU 3 as a reset signal, to the control register 16 as a set signal, and to the pre-control register 18 as a reset signal. The OR gate 17 receives the reset signal RESET and a switch request signal SR.

The pre-control register 18 also receives the switch request signal SR. The switch request signal SR is a pulse signal generated based on an address output from the CPU 3, obtained by decoding an address bus (not shown). The pre-control register 18 outputs "0" when the reset signal RESET is made active, and outputs the value of the received clock selection data when the switch request signal SR is made active. The output SP of the pre-control register 18 is sent to the pre-selector 12 and the control register 16.

The pre-selector 12 selects one of the outputs of the high-speed oscillation circuit 1 and the low-speed oscillation circuit 2, that is, one of the high-speed clock C1 and the low-speed clock C2, according to the output SP of the pre-control register 18 and outputs the selected clock to the counter 13. For example, the pre-selector 12 selects the high-speed clock C1 when the output SP of the pre-control register 18 is "0" and selects the low-speed clock C2 when the output SP is "1", and outputs the selected clock.

The counter 13 receives the output of the OR gate 17 as the reset signal, and counts the number of pulses of the output of the pre-selector 12. Every time the count value reaches a predetermined value, the counter 13 changes the level of an overflow signal CC as a detection signal and sends the signal CC to the control register 16. That is, a level change in the overflow signal CC indicates that the clock selected by the pre-selector 12 changes in signal level.

As described above, the clock detector 110 detects whether or not the clock designated by the clock selection data changes in signal level, and outputs the detection result as the detection signal.

The control register 16 is a D-flipflop of which the output SC is "1" when the reset signal RESET is made active. When the level of the overflow signal CC from the counter 13 changes, the control register 16 holds the value of the output SP of the pre-control register 18 and outputs this value to the selector 11 as the output SC. The control register 16 also outputs the value of the output SC and the like to the CPU 3 via the data bus.

The selector 11 selects one of the outputs of the high-speed oscillation circuit 1 and the low-speed oscillation circuit 2, that is, one of the high-speed clock C1 and the low-speed clock C2, according to the output SC of the control register 16, and outputs the selected clock to the CPU 3 as a clock SCK. For example, the selector 11 selects the high-speed clock C1 when the output SC of the control register 16 is "0" and selects the low-speed clock C2 when the output SC is "1", and outputs the selected clock.

Figure 2:
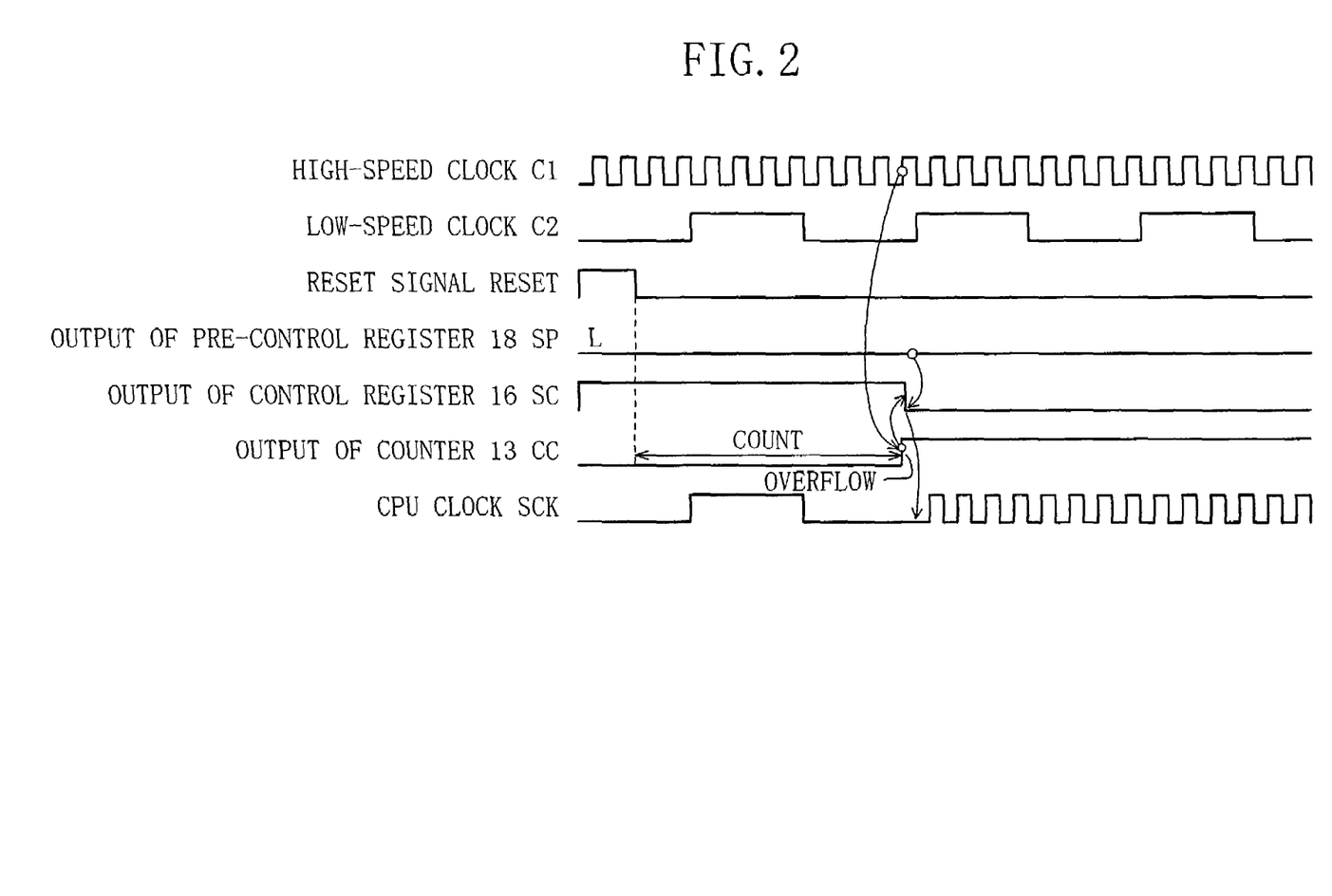
FIG. 2 is a timing chart showing operation of the clock switch device in FIG. 1 at the time of resetting in the case that both a high-speed clock and a low-speed clock change in signal level.

FIG. 2 is a timing chart showing operation of the clock switch device 10 in FIG. 1 at the time of resetting in the case that both the high-speed clock C1 and the low-speed clock C2 change in signal level. That is, in this case, both the high-speed oscillation circuit 1 and the low-speed oscillation circuit 2 are in operation, and the high-speed clock C1 and the low-speed clock C2 output from the respective oscillating circuits change in signal level.

When the reset signal RESET is made active, the counter 13 is reset via the OR gate 17, the control register 16 is set, and the pre-control register 18 is reset. The output SC of the control register 16 becomes "1", and thus the selector 11 selects the low-speed clock C2. The output SP of the pre-control register 18 becomes "0", and thus the pre-selector 12 selects the high-speed clock C1.

After release of the reset in which the reset signal RESET is made inactive, the counter 13 starts counting the number of pulses of the output of the pre-selector 12. Since the high-speed oscillation circuit 1 is in operation outputting the high-speed clock C1, the counter 13 counts the pulses and turns the overflow signal CC to an active state (to the "H" level, for example) when the tenth pulse is input, for example.

With the change of the level of the overflow signal CC, the value "0" of the output SP of the pre-control register 18 is written in the control register 16, and this turns the output SC of the control register 16 to "0". Therefore, the selector 11 selects the high-speed clock C1, and outputs this clock to the CPU 3 as the CPU clock SCK.

As described above, the clock switch device 10 is configured to select the high-speed clock C1 after resetting.

Likewise, the selector 11 selects the high-speed clock C1 in the case that the low-speed oscillation circuit 2 is not in operation and thus the low-speed clock C2 does not change in signal level.

Figure 3:
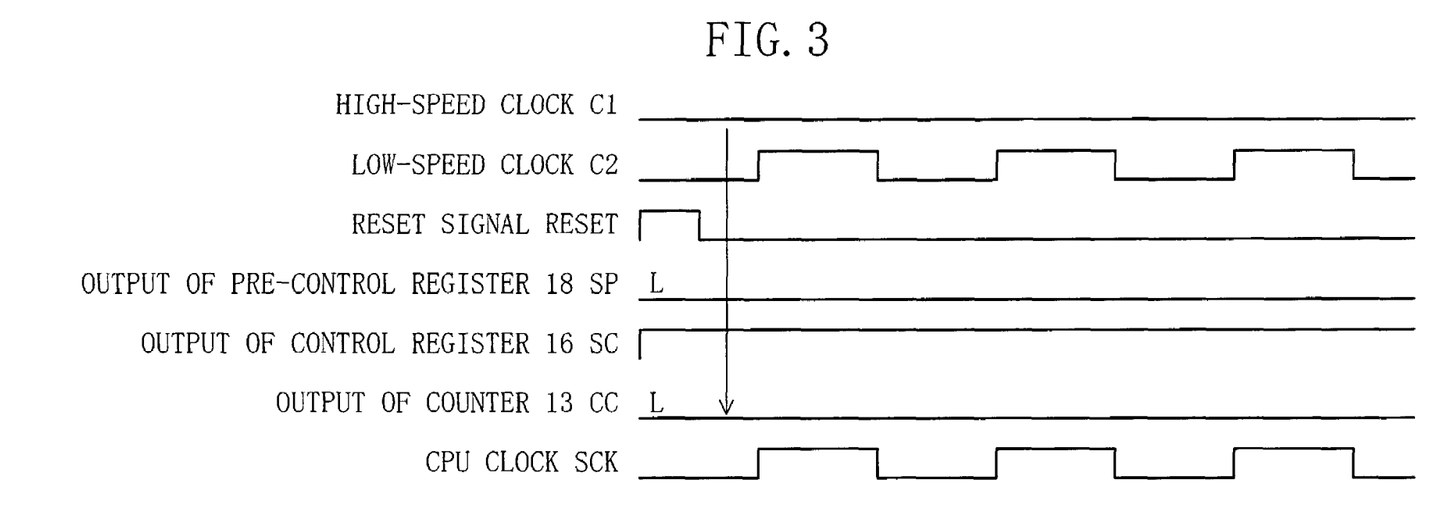
FIG. 3 is a timing chart showing operation of the clock switch device in FIG. 1 at the time of resetting in the case that the high-speed clock does not change in signal level.

FIG. 3 is a timing chart showing operation of the clock switch device 10 in FIG. 1 in the case that the high-speed clock C1 does not change in signal level. That is, in this case, the high-speed oscillation circuit 1 is not in operation while the low-speed oscillation circuit 2 is in operation.

The operation performed when the reset signal RESET is made active is substantially the same as that in FIG. 2. After release of the reset, the counter 13 counts the number of pulses of the output of the pre-selector 12. In this case, however, with no high-speed clock C1 being output from the high-speed oscillation circuit 1, the count value of the counter 13 does not change, and thus the counter 13 does not change the level of the overflow signal CC. Therefore, the output SC of the control register 16 remains "1", and the selector 11 continues selecting the low-speed clock C2 causing no change of the clock.

Figure 4:
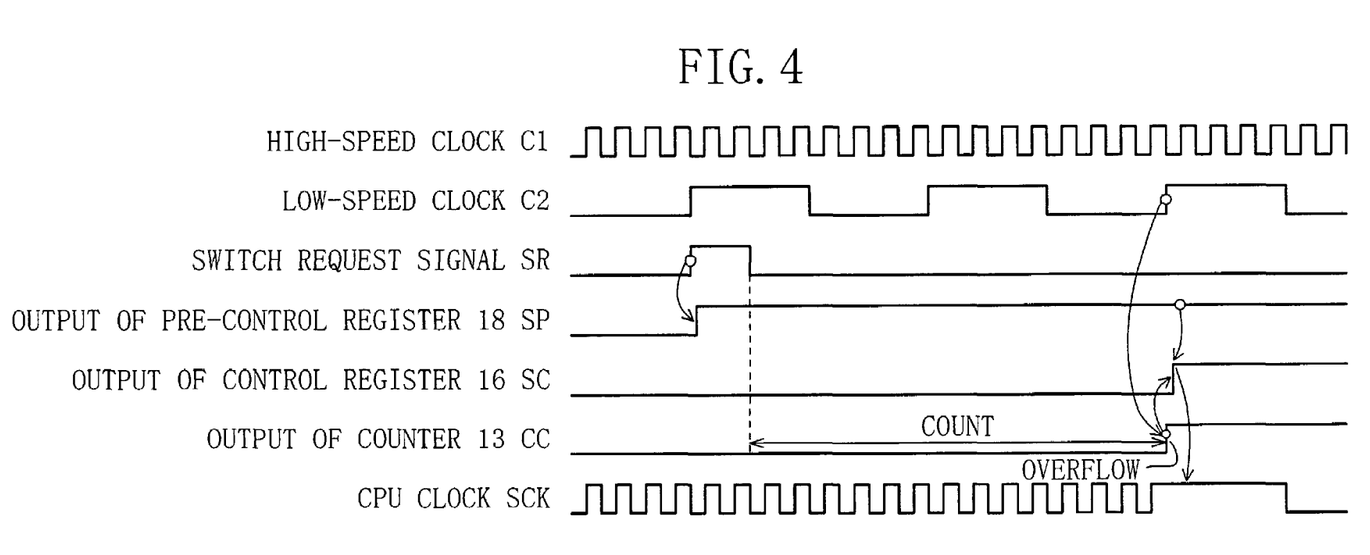
FIG. 4 is a timing chart showing operation of the clock switch device in FIG. 1 at the time of clock switching by software in the case that both the high-speed clock and the low-speed clock change in signal level.

FIG. 4 is a timing chart showing operation of the clock switch device 10 in FIG. 1 at the time of clock switching by software in the case that both the high-speed clock C1 and the low-speed clock C2 change in signal level. That is, in this case, both the high-speed oscillation circuit 1 and the low-speed oscillation circuit 2 are in operation, and the high-speed clock C1 and the low-speed clock C2 output from the respective oscillating circuits change in signal level.

After release of the reset, clock switching by software is available. The clock switching by software refers to selection of a clock by the CPU 3 and the like according to a software program. Herein, as an example, clock switching from the high-speed clock C1 to the low-speed clock C2 by software will be described.

Assume that the output SC of the control register 16 is "0", and thus the selector 11 selects the high-speed clock C1 and is outputting this signal to the CPU 3. The CPU 3 sends clock selection data "1" to the pre-control register 18 via the data bus. Also, a pulse of the switch request signal SR is sent to the pre-control register 18 based on the output of the CPU 3. Once the switch request signal SR is pulsed, the clock selection data "1" is written in the pre-control register 18, and this turns the output SP of the pre-control register 18 to "1". Thus, the pre-selector 12 selects the low-speed clock C2.

Once the switch request signal SR turns inactive, the counter 13 starts counting the number of pulses of the output of the pre-selector 12. Since the low-speed clock C2 is being output from the low-speed oscillation circuit 2, the counter 13 turns the overflow signal CC to the active state when a predetermined number of pulses are input. In the example shown in FIG. 4, the counter 13 changes the level of the overflow signal CC when it receives the second pulse for convenience of illustration.

With the change of the level of the overflow signal CC, the value "1" of the output SP of the pre-control register 18 is written in the control register 16, and this turns the output SC of the control register 16 to "1". Thus, the selector 11 selects the low-speed clock C2 and outputs this clock to the CPU 3 as the CPU clock SCK.

Clock switching from the low-speed clock C2 to the high-speed clock C1 by software can also be described in a manner similar to that described above.

Figure 5:
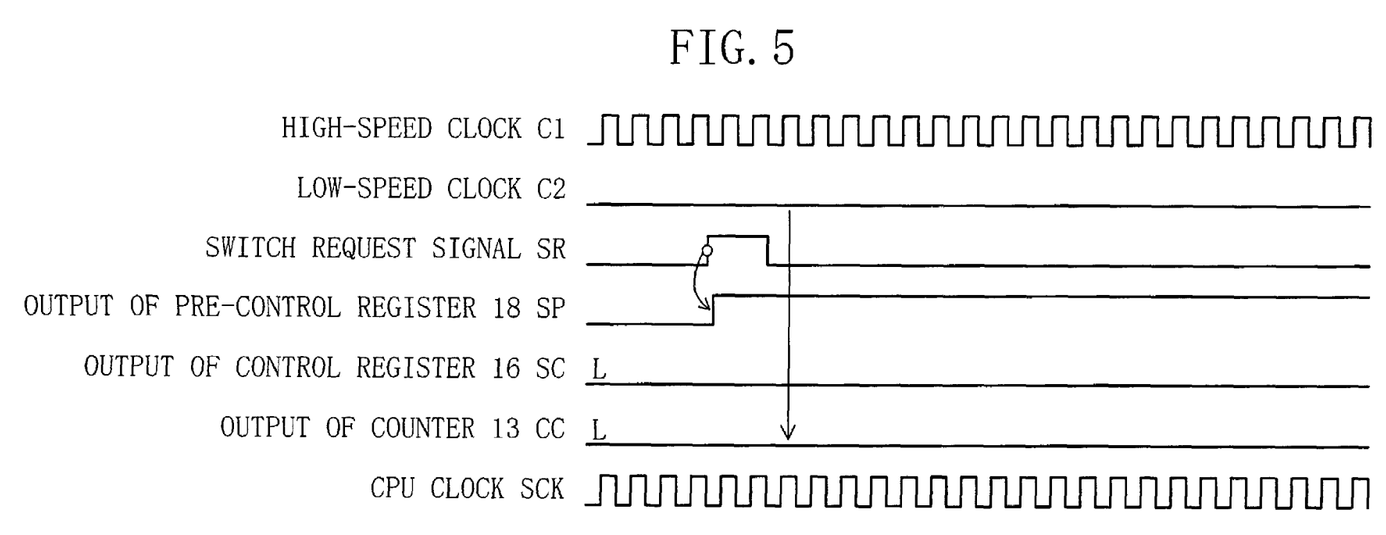
FIG. 5 is a timing chart showing operation of the clock switch device in FIG. 1 at the time of clock switching by software in the case that the low-speed clock does not change in signal level.

FIG. 5 is a timing chart showing operation of the clock switch device 10 in FIG. 1 at the time of clock switching by software in the case that the low-speed clock C2 does not change in signal level. That is, in this case, the low-speed oscillation circuit 2 is not in operation while the high-speed oscillation circuit 1 is in operation. Herein, clock switching from the high-speed clock C1 to the low-speed clock C2 will be described, as in the case in FIG. 4.

The operation until the switch request signal SR is pulsed and the pre-selector 12 selects the low-speed clock C2 output from the low-speed oscillation circuit 2 is substantially the same as that in FIG. 4. Once the switch request signal SR turns inactive, the counter 13 counts the number of pulses of the output of the pre-selector 12. In this case, however, with no change in the signal level of the low-speed clock C2, the count value of the counter 13 does not change, and thus the counter 13 does not change the level of the overflow signal CC. Therefore, since the output SC of the control register 16 remains "0", the selector 11 continues selecting the high-speed clock C1 causing no change of the clock.

Clock switching from the low-speed clock C2 to the high-speed clock C1 by software in the case that the high-speed oscillation circuit 1 does not operate can also be described in a manner similar to that described above.

As described above, after resetting, the clock switch device 10 in FIG. 1 does not select a clock (the high-speed clock C1 in the above example) of which selection is intended when the clock exhibits no change in signal level. At the time of clock switching by software, also, the clock switch device 10 does not select a clock of which selection is intended when the clock exhibits no change in signal level. In this way, the clock switch device 10 selects a clock output from an oscillation circuit in operation and outputs the selected clock to the CPU 3 both after resetting and at the time of clock switching by software. This prevents occurrence of a deadlock of the microcontroller and the like.

The CPU 3 is informed of which clock is currently being selected, the high-speed clock C1 or the low-speed clock C2, by reading the value of the control register 16. This permits verification of whether or not switching to a predetermined clock is successful.

First Alteration to Embodiment 1

Figure 6:
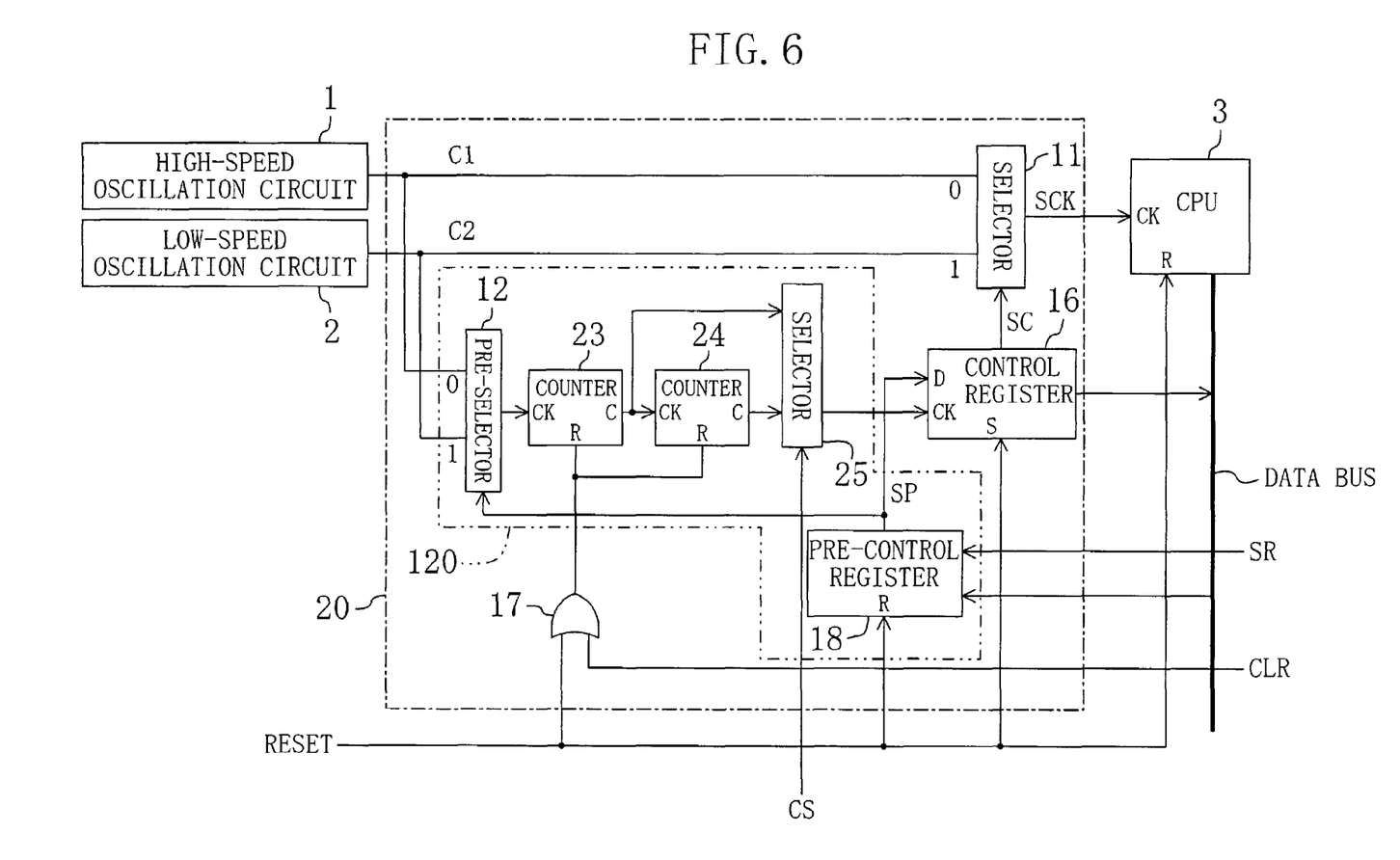
FIG. 6 is a block diagram of a microcontroller including a clock switch device of a first alteration to Embodiment 1 of the present invention.

FIG. 6 is a block diagram of a microcontroller including a clock switch device of the first alteration to Embodiment 1 of the present invention. The microcontroller of FIG. 6 includes a high-speed oscillation circuit 1, a low-speed oscillation circuit 2, a CPU 3 and a clock switch device 20. The clock switch device 20 in FIG. 6 is different from the clock switch device 10 in FIG. 1 in that counters 23 and 24 and a counter output selector 25 are used in place of the counter 13. The other components are substantially the same as those described in Embodiment 1. The pre-selector 12, the pre-control register 18, the counters 23 and 24 and the counter output selector 25 constitute a clock detector 120.

The counters 23 and 24 are connected in series. That is, the counter 24 receives an overflow signal output from the counter 23. The counter 23, the first-stage counter of the serially connected counters 23 and 24, receives the output of the pre-selector 12. The counters 23 and 24 are reset when the reset signal RESET or a clear signal CLR input into the OR gate 17 is made active. Assume that the counter 23 is a divide-by-M counter and the counter 24 is a divide-by-N counter (M and N are integers equal to or more than 2).

The counter 23 counts the number of pulses of the output of the pre-selector 12, changes the level of its overflow signal when the number of pulses counted reaches a predetermined value, that is, M in this case, and outputs the level-changed overflow signal to the counter 24 and the counter output selector 25 as a detection signal. The counter 23 repeats changing the level of its overflow signal every time the number of pulses counted reaches M.

The counter 24 counts the number of pulses of the overflow signal from the counter 23, changes the level of its overflow signal when the number of pulses counted reaches a predetermined value, that is, N in this case, and outputs the level-changed overflow signal to the counter output selector 25 as a detection signal. The counter 24 repeats changing the level of its overflow signal every time the number of pulses counted reaches N.

The counter output selector 25 selects one of the overflow signals output from the counters 23 and 24 according to a counter selection signal CS, and outputs the selected signal to the control register 16. When the counter output selector 25 selects the output of the counter 24, the time period from the resetting of the counters 23 and 24 until the switching by the selector 11 can be made long. That is, a longer time can be secured for detecting whether or not the clock selected by the pre-selector 12 changes in signal level. When the counter output selector 25 selects the output of the counter 23, the time period from the resetting of the counters 23 and 24 until the switching by the selector 11 can be shortened.

Thus, by use of the clock switch device 20, the time for detecting whether or not a clock changes in signal level can be made long at the time of resetting immediately after startup in which a certain time is required for stabilization of the clock, or at the time of switching by software in a noisy use environment, to thereby prevent malfunction due to noise. On the contrary, the time required for switching can be shortened at the time of switching by software in an environment of reduced noise and the stabilized clock.

In the first alteration, the two counters 23 and 24 are connected in series. Alternatively, the counters 23 and 24 may be connected in parallel. That is, the counter 24 may receive the output of the pre-selector 12 in place of the overflow signal output from the counter 23. Otherwise, three or more counters may be connected in parallel or in series. The switch request signal SR may be used in place of the clear signal CLR.

Second Alteration to Embodiment 1

Figure 7:
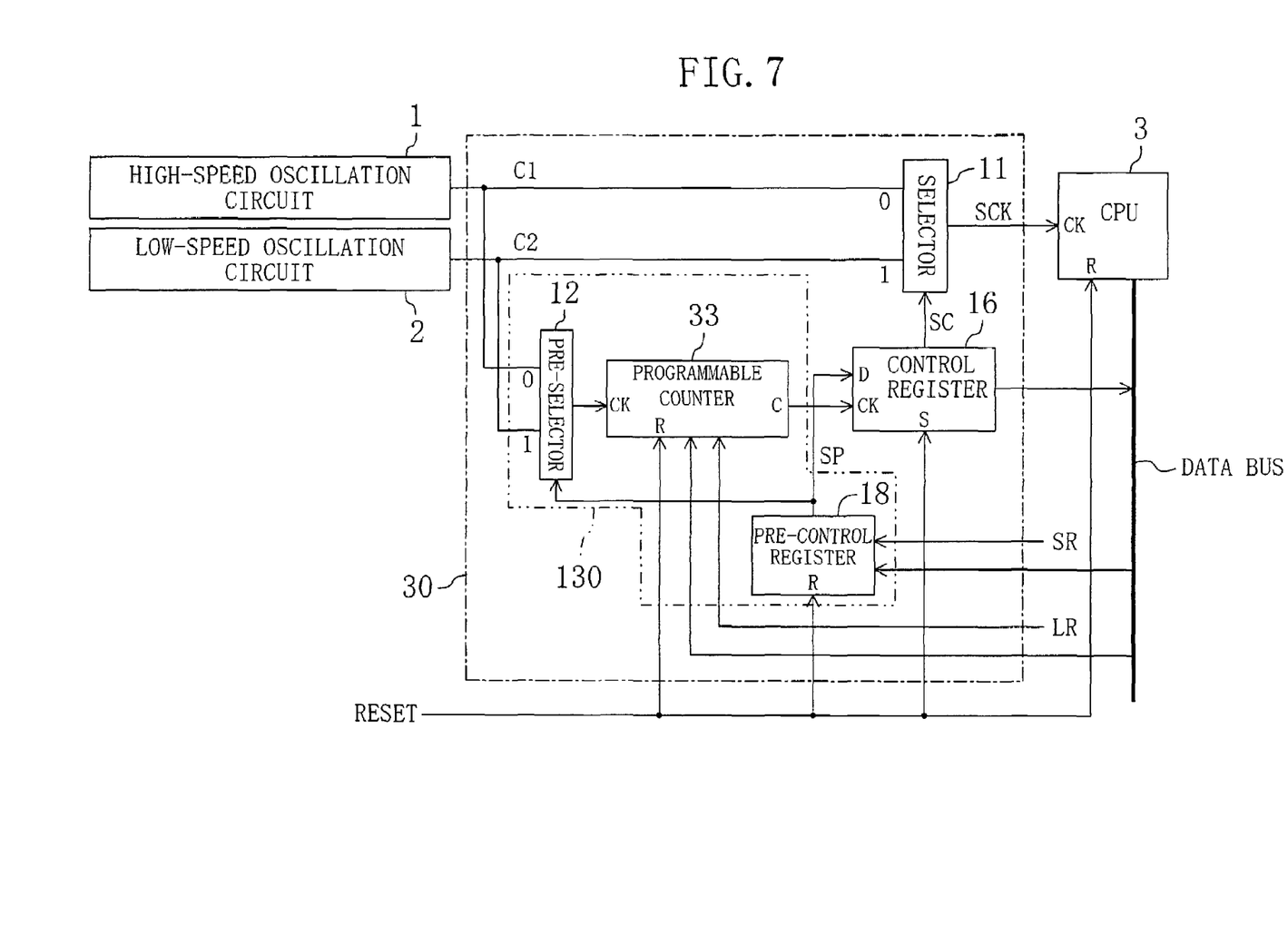
FIG. 7 is a block diagram of a microcontroller including a clock switch device of a second alteration to Embodiment 1 of the present invention.

FIG. 7 is a block diagram of a microcontroller including a clock switch device of the second alteration to Embodiment 1 of the present invention. The microcontroller of FIG. 7 includes a high-speed oscillation circuit 1, a low-speed oscillation circuit 2, a CPU 3 and a clock switch device 30. The clock switch device 30 in FIG. 7 is different from the clock switch device 10 in FIG. 1 in that a programmable counter 33 is used in place of the counter 13 and the OR gate 17. The other components are substantially the same as those described in Embodiment 1. The pre-selector 12, the pre-control register 18 and the programmable counter 33 constitute a clock detector 130.

The programmable counter 33 receives a counter set value output from the CPU 3 via the data bus and also receives a load request signal LR. The load request signal LR is a signal generated based on an address output from the CPU 3, obtained by decoding an address bus (not shown). The programmable counter 33 is reset when the reset signal RESET is made active. When the load request signal LR is made active, the programmable counter 33 sets the input counter set value.

The programmable counter 33 counts the number of pulses of the output of the pre-selector 12, changes the level of its overflow signal as a detection signal every time the number of pulses counted reaches the counter set value, and outputs the level-changed overflow signal to the control register 16.

By setting a larger counter set value, the time period from the resetting of the programmable counter 33 until the switching by the selector 11 can be made longer. That is, a longer time can be secured for detecting whether or not the clock selected by the pre-selector 12 changes in signal level. On the contrary, by setting a smaller counter set value, the time period from the setting of the programmable counter 33 until the switching by the selector 11 can be shortened.

Thus, by use of the clock switch device 30, the time for detecting whether or not a clock changes in signal level can be made long at the time of resetting immediately after startup in which a long time is required for stabilization of the clock, or at the time of switching by software in a noisy use environment, to thereby prevent malfunction due to noise. On the contrary, the time required for switching can be shortened at the time of resetting immediately after startup in which only a short time is required for stabilization of the clock, or at the time of switching by software in an environment of reduced noise. That is, the clock switch device 30 can operate properly according to the use environment and switching conditions by adjusting the counter set value.

Embodiment 2

Figure 8:
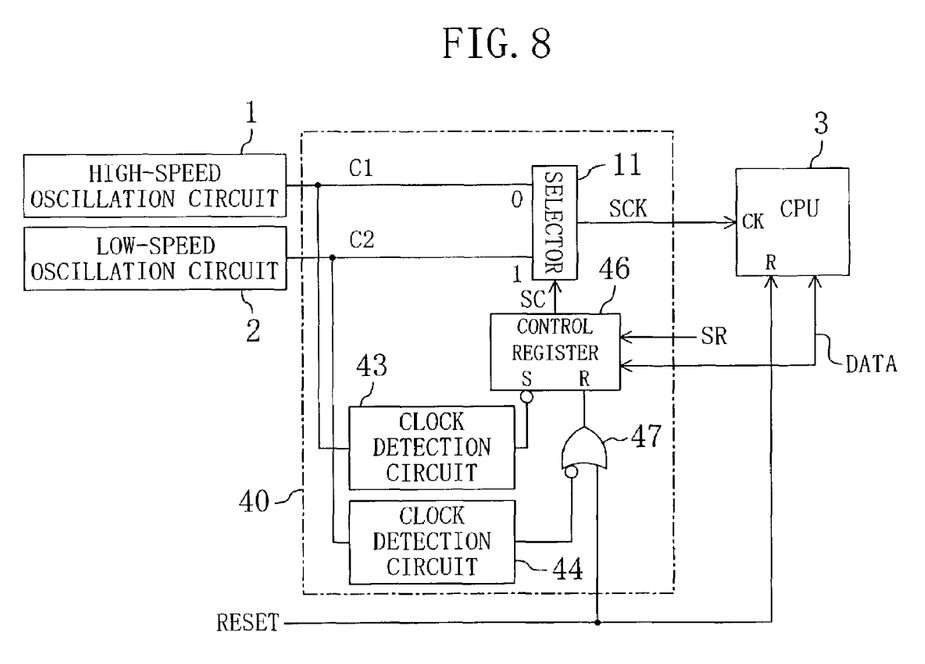
FIG. 8 is a block diagram of a microcontroller including a clock switch device of Embodiment 2 of the present invention.

FIG. 8 is a block diagram of a microcontroller including a clock switch device of Embodiment 2 of the present invention. The microcontroller of FIG. 8 includes a high-speed oscillation circuit 1, a low-speed oscillation circuit 2, a CPU 3 and a clock switch device 40. The clock switch device 40 includes a selector 11, clock detection circuits 43 and 44, a control register 46 and an OR gate 47. The high-speed oscillation circuit 1, the low-speed oscillation circuit 2, the CPU 3 and the selector 11 are the same as those described in Embodiment 1, and therefore the description thereof is omitted here. The clock detection circuits 43 and 44 may be counters, circuits for detecting an edge of a signal and the like, for example.

Referring to FIG. 8, the clock detection circuit 43 detects whether or not the high-speed oscillation circuit 1 is in operation, that is, whether or not the high-speed clock C1 changes in signal level. When the high-speed clock C1 changes in signal level, the output of the clock detection circuit 43 to the control register 46 as a detection signal is turned to the "H" level, for example. Likewise, the clock detection circuit 44 detects whether or not the low-speed oscillation circuit 2 is in operation, that is, whether or not the low-speed clock C2 changes in signal level. When the low-speed clock C2 changes in signal level, the output of the clock detection circuit 44 to the OR gate 47 as a detection signal is turned to the "H" level, for example.

The OR gate 47 calculates logical OR of the reset signal RESET and the inverse of the output of the clock detection circuit 44, and outputs the result to the control register 46. The CPU 3 outputs clock selection data designating the clock to be selected to the control register 46.

The control register 46 is a RS-flipflop, for example, which is set and outputs "1" when the output of the clock detection circuit 43 is "L", and is reset and outputs "0" when the output of the OR gate 47 is "H". The control register 46 also receives a switch request signal SR that is substantially the same as that described in Embodiment 1. The control register 46 outputs the value of the input clock selection data to the selector 11 when the switch request signal SR is active.

The operation of the clock switch device 40 in FIG. 8 at the time of resetting will be described. First, the case that both the high-speed oscillation circuit 1 and the low-speed oscillation circuit 2 are in operation, that is, the high-speed clock C1 and the low-speed clock C2 change in signal level will be described.

When the reset signal RESET is made active, the control register 46 is reset via the OR gate 47. The control register 46 then outputs data "0" to the selector 11 to enable the selector 11 to select the high-speed clock C1. The selector 11 selects the high-speed clock C1 and outputs the selected clock to the CPU 3. The clock detection circuits 43 and 44 detect that the high-speed clock C1 and the low-speed clock C2 change in signal level, and turn the respective outputs to the "H" level. With the "H"-level outputs, the control register 46 is neither set nor reset, and keeps the output "0". The selector 11 therefore continues selecting the high-speed clock C1.

As described above, the clock switch device 40 is configured to select the high-speed clock C1 after resetting.

In the case that the high-speed oscillation circuit 1 is in operation but the low-speed oscillation circuit 2 is not in operation, the clock detection circuit 44 does not detect a change in the signal level of the low-speed clock C2, and thus outputs the "L" level. This causes the control register 46 to be reset and output "0". The selector 11 therefore selects the high-speed clock C1 and outputs the selected clock to the CPU 3.

In the case that the high-speed oscillation circuit 1 is not in operation although the low-speed oscillation circuit 2 is in operation, the clock detection circuit 43 does not detect a change in the signal level of the high-speed clock C1, and thus outputs the "L" level. This causes the control register 46 to be set and output "1" after release of the reset. The selector 11 therefore selects the low-speed clock C2 and outputs the selected clock to the CPU 3. The clock detection circuit 44 outputs the "H" level, and thus the control register 46 is not reset via the OR gate 47.

The operation of the clock switch device 40 in FIG. 8 at the time of clock switching by software will be described. Herein, clock switching from the high-speed clock C1 to the low-speed clock C2 by software will be described.

First, the case that both the high-speed oscillation circuit 1 and the low-speed oscillation circuit 2 are in operation will be described. Assume that the output SC of the control register 46 is currently "0" and thus the selector 11 selects the high-speed clock C1 and is outputting this clock to the CPU 3. Both the clock detection circuits 43 and 44 detect a change in the signal levels of the high-speed clock C1 and the low-speed clock C2, and output the "H" level. Therefore, the control register 46 is neither set nor reset.

The CPU 3 sends the clock selection data "1" to the control register 46. Also, the switch request signal SR is sent to the control register 46 based on the output of the CPU 3. Once the switch request signal SR is made active, the clock selection data "1" is written in the control register 46. This turns the output SC of the control register 46 to "1", and thus the selector 11 selects the low-speed clock C2 and outputs the selected clock to the CPU 3.

In the case that the high-speed oscillation circuit 1 is in operation but the low-speed oscillation circuit 2 is not in operation, the clock detection circuit 44 outputs the "L" level. The control register 46 is then reset via the OR gate 47, and thus outputs "0" with no clock selection data written therein. The selector 11 therefore continues selecting the high-speed clock C1.

As described above, when any of the detection signals indicates that no change in signal level is observed in the corresponding clock, the control register 46 is set or reset, changes data held therein to avoid the clock in question from being selected, and outputs the resultant data. With this configuration, at the time of clock switching by software, the clock switch device 40 in FIG. 8 does not select a clock of which selection is intended when the clock exhibits no change in signal level. In other words, the clock switch device 40 selects a clock output from an oscillation circuit in operation and sends the clock to the CPU 3. This prevents occurrence of a deadlock of the microcontroller and the like.

In the above embodiments, the clock switch device selects one from two clocks output from the high-speed oscillation circuit and the low-speed oscillation circuit and outputs the selected clock. Alternatively, selection of one from three or more clocks is possible according to the present invention.

Thus, according to the present invention, at the time of clock switching by software and the like in which the clock to be selected is specified, a change in the signal level of a clock to be selected next is detected, and selection of the clock is avoided if the clock is at a halt. In this way, occurrence of a deadlock of the microcontroller and the like is prevented.

At the time of resetting, a clock output from an oscillation circuit in operation is selected. Therefore, it is unnecessary to use a predetermined clock from an oscillation circuit for startup. This eliminates the necessity of providing an external crystal for an oscillation circuit for startup, and thus reduces the cost for external components.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A clock switch device comprising:
    a clock detector for receiving a plurality of clocks and clock selection data designating a clock to be selected, detecting whether or not the clock designated by the clock selection data among the plurality of clocks changes in signal level, and outputting the result as a detection signal;
    a control register for holding anti outputting the clock selection data when the detection signal indicates that the clock designated by the clock selection data changes in signal level; and
    a selector for receiving the plurality of clocks and selecting a clock corresponding to the output of the control register among the plurality of clocks.

2. The device of claim 1, wherein the clock detector comprises:
    a pre-control register for holding and outputting the clock selection data;
    a pre-selector for receiving the plurality of clocks, selecting a clock corresponding to the output of the pre-control register among the plurality of clocks, and outputting the selected clock; and
    a counter for counting the number of pulses of the output of the pre-selector and outputting an overflow signal changing in signal level when the count value reaches a predetermined value as the detection signal.

3. The device of claim 2, wherein the counter is a programmable counter capable of changing the predetermined value.

4. The device of claim 2, wherein the counter initializes the count value when the counter receives a switch request signal for enabling the clock selection data to be held in the pre-control register.

5. The device of claim 1, wherein the clock detector comprises:
    a pre-control register for holding and outputting the clock selection data;
    a pre-selector for receiving the plurality of clocks, selecting a clock corresponding to the output of the pre-control register among the plurality of clocks, and outputting the selected clock;
    a plurality of counters connected in series, each for counting the number of pulses of an input signal and outputting an overflow signal changing in signal level every time the count value reaches a predetermined value; and
    a counter output selector for selecting one of the overflow signals output from the plurality of counters according to a counter selection signal and outputting the selected signal as the detection signal,
    wherein the first-stage counter of the plurality of counters connected in series receives the output of the pre-selector.

6. The device of claim 1, wherein the clock detector comprises:
    a pit-control register for holding and outputting the clock selection data;
    a pre-selector for receiving the plurality of clocks, selecting a clock corresponding to the output of the pre-control register among the plurality of clocks, and outputting the selected clock;
    a plurality of counters, each for counting the number of pulses of the output of the pre-selector and outputting an overflow signal changing in signal when the count value reaches a predetermined value; and a counter output selector for selecting one of the overflow signals output from the plurality of counters according to the counter selection signal and outputting the selected signal as the detection signal.

7. The device of claim 1, wherein the clock detector detects whether or not a predetermined clock changes in signal level after resetting and outputs the result as the detection signal, and the control register outputs the corresponding data so that the selector selects the predetermined clock when the detection signal indicates that the clock changes in signal level.

8. The device of claim 7, wherein the clock detector comprises:

a pre-control register for holding and outputting the clock selection data;

a pre-selector for receiving the plurality of clocks, selecting a clock corresponding to the output of die pre-control register among the plurality of clocks, and outputting the selected clock; and a counter for counting the number of pulses of the output of the pre-selector and outputting an overflow signal changing in signal level when the count value reaches a predetermined value.

9. The device of claim 8, wherein the counter initializes the count value when the counter receives either a switch request signal for permitting the clock selection data to be held in the pre-control register or a reset signal for enabling the resetting.

10. A clock switch device comprising:

a plurality of clock detectors for receiving different clocks, detecting whether or not the clocks change in signal level, and outputting the results as detection signals;

a control register for receiving and holding clock selection data designating a clock to be selected, changing the held data and outputting changed data when any of the detection signals indicates that the corresponding clock does not change in signal level, so that the corresponding clock is not selected; and a selector for selecting a clock corresponding to the output of the control register among the plurality of clocks input into the plurality of clock detectors.

11. The device of claim 10, wherein after resetting, the control register outputs data corresponding to a predetermined clock to enable the selector to select the clock.

12. A microcontroller comprising a clock switch device and a CPU, wherein the clock switch device comprises:

a clock detector for receiving a plurality of clocks and clock selection data designating a clock to be selected, detecting whether or not the clock designated by the clock selection data among the plurality of clocks changes in signal level, and outputting the result as a detection signal;

a control register for holding and outputting the clock selection data when the detection signal indicates that the clock designated by the clock selection data changes in signal level; and a selector for receiving the plurality of clocks and selecting a clock corresponding to the output of the control register among the plurality of clocks, and wherein the CPU outputs the clock selection data by executing software.

* * * * *